(12) United States Patent
Steiner et al.

(10) Patent No.: US 9,524,790 B1
(45) Date of Patent: Dec. 20, 2016

(54) FLASH MEMORY CELLS WEAR REDUCTION

(71) Applicant: AVAGO TECHNOLOGIES GENERAL IP (SINGAPORE) PTE. LTD., Yishun (SG)

(72) Inventors: Avi Steiner, Kiriat Motzkin (IL); Hanan Weingarten, Herzelia (IL); Erez Sabbag, Koranit (IL)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/860,949

(22) Filed: Sep. 22, 2015

Related U.S. Application Data

(60) Provisional application No. 62/200,046, filed on Aug. 2, 2015.

(51) Int. Cl.
| | | |
|---|---|---|
| *G11C 16/28* | (2006.01) | |
| *G11C 16/10* | (2006.01) | |
| *G11C 16/08* | (2006.01) | |
| *G11C 16/14* | (2006.01) | |
| *G11C 16/34* | (2006.01) | |
| *G06F 11/10* | (2006.01) | |
| *G11C 29/52* | (2006.01) | |

(52) U.S. Cl.
CPC ............ *G11C 16/28* (2013.01); *G11C 16/08* (2013.01); *G11C 16/10* (2013.01); *G11C 16/14* (2013.01); *G11C 16/3418* (2013.01); *G06F 11/1048* (2013.01); *G06F 11/1072* (2013.01); *G11C 29/52* (2013.01)

(58) Field of Classification Search
CPC ..... G11C 16/28; G11C 16/10; G11C 16/3418; G11C 16/08; G11C 16/14; G11C 29/52; G06F 11/1072; G06F 11/1048
See application file for complete search history.

(56) References Cited

U.S. PATENT DOCUMENTS

| | | | | |
|---|---|---|---|---|
| 2009/0049364 A1* | 2/2009 | Jo | ...................... | G06F 11/1072 714/763 |
| 2011/0157985 A1* | 6/2011 | Sudo | ................... | G06F 11/1048 365/185.09 |
| 2011/0182119 A1* | 7/2011 | Strasser | ................. | G11C 16/28 365/185.03 |
| 2012/0320672 A1* | 12/2012 | Meir | ........................ | G11C 7/06 365/185.03 |
| 2014/0040704 A1* | 2/2014 | Wu | ........................ | G11C 29/52 714/773 |
| 2015/0036426 A1* | 2/2015 | Kwak | ..................... | G11C 16/10 365/185.03 |

* cited by examiner

*Primary Examiner* — Richard Elms
*Assistant Examiner* — Ajay Ojha

(57) ABSTRACT

A method for wear reduction of a flash memory module, the method may include reading data stored in a group of flash memory cells to provide a read data; wherein the reading comprise supplying a bias voltage that is lower than a write bias voltage; wherein the write bias voltage was supplied to the group of flash memory cells during a writing of the data to the group of flash memory cells; and decoding the read data, by applying a decoding process of a given complexity, to provide decoded data.

31 Claims, 11 Drawing Sheets

FLASH MEMORY CELLS WEAR REDUCTION

RELATED APPLICATIONS

This application claims priority from U.S. provisional patent 62/200,046, filing date Aug. 2, 2015, which is incorporated herein by reference.

BACKGROUND

With the continuous scaling of NAND flash memories, it becomes a greater challenge to provide guaranteed reliability at high performance and high endurance. One of the key tools for enabling NAND flash memory scaling is advanced controllers with high capabilities of digital signal processing and error correction. In this invention a building block of a digital signal processor (DSP) is suggested, for extending the NAND flash memory endurance and enabling higher performance. This building block controls fundamental parameters of the physical read/write of the flash array, which increase the number of reads that can be done from a programmed block before a refresh is required.

SUMMARY

Embodiments of the present disclosure include systems, methods and non-transitory computer readable media, as illustrated in the claims.

According to an embodiment of the invention there may be provided a non-transitory computer readable medium that stores instructions that once executed by a computer causes the computer to perform the steps of: reading data stored in a group of flash memory cells to provide a read data; wherein the reading may include supplying a bias voltage that is lower than a write bias voltage; wherein the write bias voltage was supplied to the group of flash memory cells during a writing of the data to the group of flash memory cells; and decoding the read data, by applying a decoding process of a given complexity, to provide decoded data.

According to an embodiment of the invention there may be provided a system such as a memory controller that is configured to perform the steps of reading data stored in a group of flash memory cells to provide a read data; wherein the reading may include supplying a bias voltage that is lower than a write bias voltage; wherein the write bias voltage was supplied to the group of flash memory cells during a writing of the data to the group of flash memory cells; and decoding the read data, by applying a decoding process of a given complexity, to provide decoded data.

According to an embodiment of the invention there may be provided a method for wear reduction of a flash memory module, the method may include: reading data stored in a group of flash memory cells to provide a read data; wherein the reading may include supplying a bias voltage that is lower than a write bias voltage; wherein the write bias voltage was supplied to the group of flash memory cells during a writing of the data to the group of flash memory cells; and decoding the read data, by applying a decoding process of a given complexity, to provide decoded data.

The method may include increasing, when the decoding of the read data fails and while the bias voltage is below a bias threshold, a value of the bias voltage and repeating the reading and the decoding.

The bias threshold may equal the write bias voltage.
The bias threshold may exceed the write bias voltage.
The bias threshold may be below the write bias voltage.

When the decoding of the read data fails and the bias voltage reaches the bias threshold then the method may include applying another decoding process in the read data; wherein a complexity of the other decoding process may exceed the given complexity.

When the decoding of the read data fails and the bias voltage reaches the bias threshold then the method may include performing one or more additional reads of the data.

The decoding process may be a hard decoding process and the other decoding process may be a soft decoding process.

The method may include adjusting read thresholds to the bias voltages supplied to the group of flash memory cells before increasing the value of the bias voltage.

The method may include selecting read thresholds out of predefined read thresholds that match the bias voltages supplied to the group of flash memory cells before increasing the value of the bias voltage The method may include scheduling the group of flash memory cells to be refreshed when a number of reading related to a block that may include the group of flash memory cells reaches a reading threshold and a bit error rate (BER) related to the group of flash memory cells reaches a predefined BER threshold.

The method may include scheduling the group of flash memory cells to be refreshed when a number of reading of the group of flash memory cells reaches a reading threshold and a bit error rate (BER) related to the group of flash memory cells reaches a predefined BER threshold.

The method may include determining a bias voltage to be applied during a next read of the group of flash memory cells in response to an outcome of the reading of the data stored in the group of flash memory cells.

The method may include determining a bit error rate (BER) related to the group of flash memory cells and determining a bias voltage to be applied during a next read of the group of flash memory cells in response to the BER related to the group of flash memory cells and to a number of reads of the group of flash memory cells.

The method may include determining a bit error rate (BER) related to the group of flash memory cells and determining a bias voltage to be applied during a next read of the group of flash memory cells in response to the BER related to the group of flash memory cells and to a number of reads related to a block that may include the group of flash memory cells.

The method may include scheduling the group of flash memory cells to be erased; and performing multiple dummy read operations of the group of flash memory before erasing the group of flash memory; wherein each dummy read operation may include supplying the write bias voltage to the group of flash memory cells.

The method may include scheduling the group of flash memory cells to be erased; and performing multiple dummy read operations of the group of flash memory before erasing the group of flash memory.

The write bias voltage may be selected as a highest bias voltage within a range of allowable bias voltages.

According to an embodiment of the invention there may be provided a non-transitory computer readable medium that stores instructions that once executed by a computer causes the computer to perform the steps of: reading data stored in a group of flash memory cells to provide a read data; wherein the reading may include supplying a bias voltage that may be lower than a write bias voltage; wherein the write bias voltage was supplied to the group of flash memory cells during a writing of the data to the group of flash memory cells; decoding the read data, by applying a decoding process of a given complexity, to provide decoded data; when the decoding of the read data fails and while the bias voltage may be below the a bias threshold applying another decoding process in the read data; wherein a complexity of the other decoding process exceeds the given complexity; when the other decoding of the read data fails and while the bias voltage may be below the write bias voltage increasing a value of the bias voltage and repeating the reading and the decoding.

According to an embodiment of the invention there may be provided a system such as a memory controller that is configured to perform the steps of reading data stored in a group of flash memory cells to provide a read data; wherein the reading may include supplying a bias voltage that may be lower than a write bias voltage; wherein the write bias voltage was supplied to the group of flash memory cells during a writing of the data to the group of flash memory cells; decoding the read data, by applying a decoding process of a given complexity, to provide decoded data; when the decoding of the read data fails and while the bias voltage may be below the a bias threshold applying another decoding process in the read data; wherein a complexity of the other decoding process exceeds the given complexity; when the other decoding of the read data fails and while the bias voltage may be below the write bias voltage increasing a value of the bias voltage and repeating the reading and the decoding.

According to an embodiment of the invention there may be provided a method for wear reduction of a flash memory module, the method may include reading data stored in a group of flash memory cells to provide a read data; wherein the reading may include supplying a bias voltage that may be lower than a write bias voltage; wherein the write bias voltage was supplied to the group of flash memory cells during a writing of the data to the group of flash memory cells; decoding the read data, by applying a decoding process of a given complexity, to provide decoded data; when the decoding of the read data fails and while the bias voltage may be below the a bias threshold applying another decoding process in the read data; wherein a complexity of the other decoding process exceeds the given complexity; when the other decoding of the read data fails and while the bias voltage may be below the write bias voltage increasing a value of the bias voltage and repeating the reading and the decoding.

When the decoding of the read data fails and the bias voltage reaches the bias threshold then performing one or more additional reads of the data.

The decoding process may be a hard decoding process and the other decoding process may be a soft decoding process.

The method may include adjusting read threshold to the bias voltages supplied to the group of flash memory cells before increasing the value of the bias voltage and performing additional reads of the group of flash memory cells.

The method may include scheduling the group of flash memory cells to be refreshed when a number of reading reaches a reading threshold and a bit error rate (BER) related to the group of flash memory cells reaches a predefined BER threshold.

The method may include scheduling the group of flash memory cells to be erased; and performing multiple dummy read operations of the group of flash memory before erasing the group of flash memory.

The write bias voltage may be selected as a highest bias voltage within a range of allowable bias voltages.

According to an embodiment of the invention there may be provided a non-transitory computer readable medium that stores instructions that once executed by a computer causes the computer to perform the steps of: reading data stored in a group of flash memory cells to provide a read data; decoding the read data, by applying a decoding process of a given complexity, to provide decoded data; scheduling the group of flash memory cells to be erased; and performing multiple dummy read operations of the group of flash memory before erasing the group of flash memory.

According to an embodiment of the invention there may be provided a system such as a memory controller that is configured to perform the steps of reading data stored in a group of flash memory cells to provide a read data; decoding the read data, by applying a decoding process of a given complexity, to provide decoded data; scheduling the group of flash memory cells to be erased; and performing multiple dummy read operations of the group of flash memory before erasing the group of flash memory.

According to an embodiment of the invention there may be provided a method for wear reduction of a flash memory module, the method may include: reading data stored in a group of flash memory cells to provide a read data; decoding the read data, by applying a decoding process of a given complexity, to provide decoded data; scheduling the group of flash memory cells to be erased; and performing multiple dummy read operations of the group of flash memory before erasing the group of flash memory.

Each dummy read operation may include supplying a write bias voltage to the group of flash memory cells; wherein the write bias voltage was supplied to the group of flash memory cells during a writing of the data to the group of flash memory cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
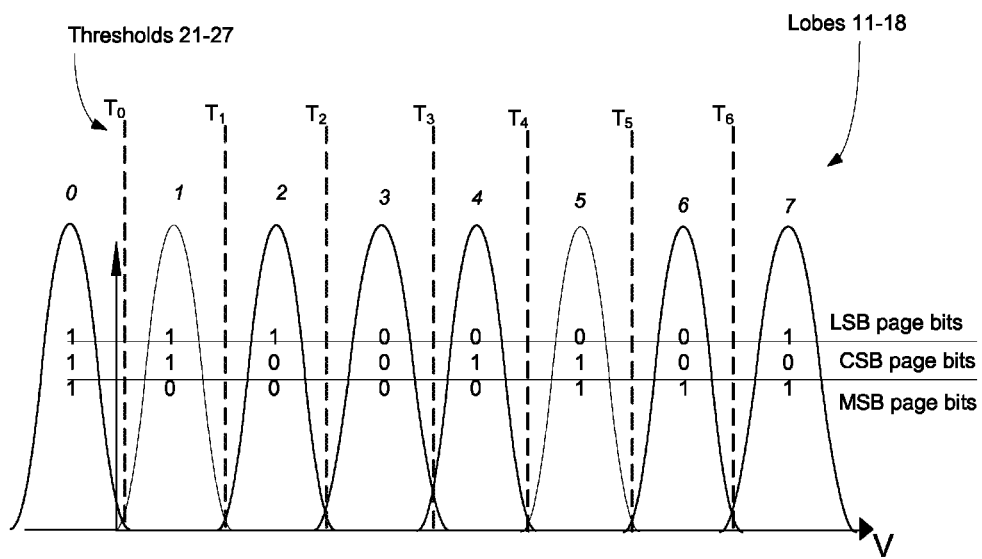
FIG. 1 illustrates a prior art threshold voltage distribution.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The following invention presents a few schemes for obtaining more than a single bit sense output per cell, in order to allow soft information to be outputted. In addition, this invention also presents methods for internally utilizing this soft information to allow outputting only hard information from the NAND but with higher reliability.

There is provided a building block of the DSP within an advanced NAND flash controller. The main goal here is to extend the NAND flash memory endurance and enable higher performance. This building block controls fundamental parameters of the physical read/write of the flash array. The bias-voltage, known also as pass-voltage, is used during read and write operations and applied on rows which are meant to be in bypass mode. However, applying the bias-voltage has a small effect on the non-selected cells, and its effect is accumulated over time and cycles. E.g. as the number of read operations increases, the minor programming side effect on the non-selected rows becomes more pronounced.

The main factor which influences the non-selected rows is the bias-voltage applied on the gates of these rows. The higher the bias-voltage, the stronger is the programming effect on the non-selected rows. In addition, the side-effect programming accumulated over many read operations may have effect on the erase distribution, which enables a better programming result, thus extending the achievable endurance.

There are provided several methods for dynamic adaptation of the bias voltage during read operations, these methods maximize the number of pages reads that can be done before the worst page BER exceeds some reliability threshold which triggers a refresh. Extending the intervals between refreshes simply reduces the write amplification and prolongs the NAND flash memory lifespan, by avoiding excess programming. Another benefit is the operation at high endurance, which means higher page BER following programming. If the BER increase due to reads is sufficiently mild, then a low refresh rate can be provided even at high endurance.

Other methods utilize the read operation by applying dummy-reads before erase, and obtaining lower BER following the program operation.

There are provided methods for adapting the bias-voltage of a NAND flash memory for obtaining more reads before a refresh cycle is required (for read disturb resilience).

There are provided methods for increasing endurance by applying intentional read operations to reduce wear.

The execution of any of the suggested methods may lower write amplification—achieved by allowing more reads before a refresh cycle is required.

The execution of any of the suggested methods may provide a NAND flash memory with a higher endurance—increased number of writes before NAND flash memory end of life, obtained from lower refresh rate and intentional read operations which reduce wear.

According to an embodiment of the invention there may be provided a method that may include (a) programming at high bias voltage, read operations are done at low bias voltage. (b) If read at low bias fails increase the bias voltage, adapt read thresholds, and attempt reading and decoding again. (c) repeating step (b) until the highest allowed bias voltage is reached, and only then if hard decoding fails, soft read and decoding takes place.

Thresholds can be taken from a threshold table per bias voltage—saves thresholds' adaptation.

Thresholds' acquisition can be done using quick threshold estimation—such as illustrate din U.S. patent application Ser. No. 13/733,774 titled "Read threshold determination using reference read thresholds" which is incorporated herein by reference.

For low cycle counts the bias voltage can be the default bias voltage, i.e. use low bias read flow only if P/E cycles>C1.

When reading with low bias—the method may try to decode with hard/soft and only if both fail, try decoding with hard/soft at high bias. This may include measure RBER of successful decoding at high BER and when BER>THBER—mark block for refresh.

According to an embodiment of the invention there may be provided a prediction of adequate bias voltage before read operations—if BER is relatively high start read with corresponding bias which will enable hard decoding (performance feature). For performance optimization, it is possible to read with high bias.

Soft decoding effort is a function of the bias voltage used—and may be performed only in highest bias soft read—may include performing full effort (highest complexity) soft decoding.

According to an embodiment of the invention for every bias voltage use a table of default read thresholds. This is due to different VT-distribution per bias voltage.

According to an embodiment of the invention a method may be provided and may include performing dummy page reads to "disturbed" pages in order to assess if refresh is required. This may be triggered by read counter of page/block.

According to an embodiment of the invention a method may be provided and may include performing dummy read operations with high bias before erase, and then perform erase+program. This modified erase operation does not have to take place every cycle. This may include performing, every predefined number (N) of P/E cycles, multiple (M) dummy-read operations and then an erase.

The modified erase process that include dummy readings may be executed only for P/E cycles that exceed a predefined threshold (C0) thereby providing high endurance.

NAND Flash Memory Read Background

FIG. 1 demonstrates a voltage threshold distribution 10 of a triple-level cell (TLC) flash memory. The voltage threshold distribution include eight lobes 11-18 and can be read using seven thresholds 21-27.

Three page types are defined for the 8-level programming. A most significant bit (MSB) page type, which is also called lower page, can be read using thresholds $T_0$ and $T_4$, a central significance bit (CSB), which is also called middle page, can be read using thresholds $T_1$, $T_3$ and $T_5$, and a lower significance bit (LSB), which is also called upper page, can be read using thresholds $T_2$ and $T_6$ (note that other page type settings are possible). When the number of errors is sufficiently low a single page read can be used for recovering the original payload data, and this operation is called hard decoding. This is since the input to the decoder is only a logical value of the bit sampled once from the NAND (0/1). In case the hard decoding fails, a digital signal processing (DSP) unit may perform multiple reads to obtain soft information at the decoder input. From the multiple reads the soft information may be computed, in the form of log-likelihood ratio (LLR), for every codeword bit, and then soft decoding can be applied.

Figure 2:
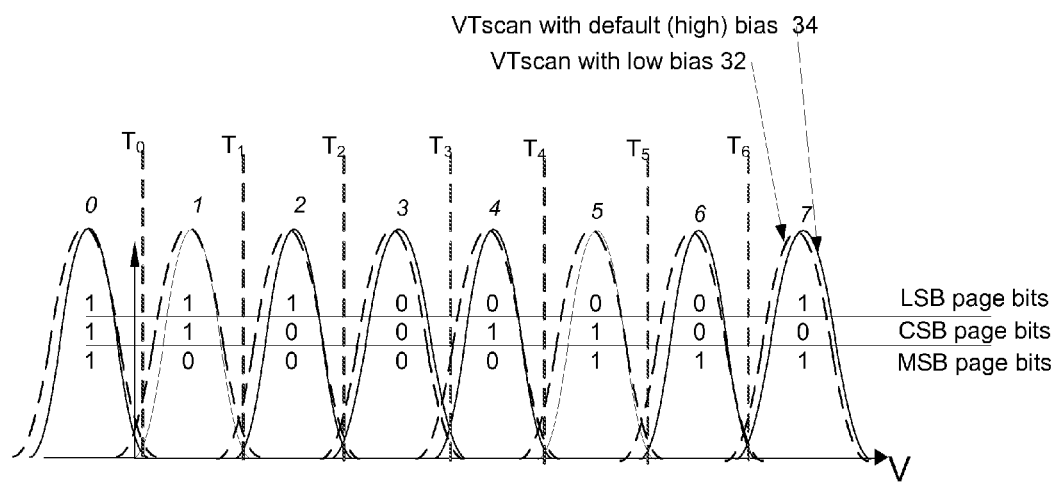
FIG. 2 illustrates a prior art threshold voltage distribution.

When a page is read many times, it disturbs its neighboring rows, since the non-selected rows are in pass-through state obtained by applying a bias voltage. This read disturb effect is well known, but its magnitude depends on the values of the actual bias-voltage applied during the read operation. When applying a lower bias voltage (curve 32) compared to the original bias-voltage used for programming, the voltage threshold distribution may be noisier. Consider the example in FIG. 2, where the solid curve is the voltage threshold (VT) distribution 34 when done using the original programming ("high") bias voltage. When performing a VT scan with a lower bias voltage than the original bias voltage, there is an effect of shift in the VT distribution as well as additional noise on the read results, i.e. the distribution of each lobe becomes wider.

This is the reason why usually a standard controller performs read operations using the same bias voltage as used during the programming. However, an advanced controller that can adapt the read thresholds and has a strong ECC which may correct many errors can easily overcome the additional noise, and successfully read using a lower bias voltage. The benefit of using lower bias during read is to reduce the disturbance induced on non-selected rows.

Figure 3:
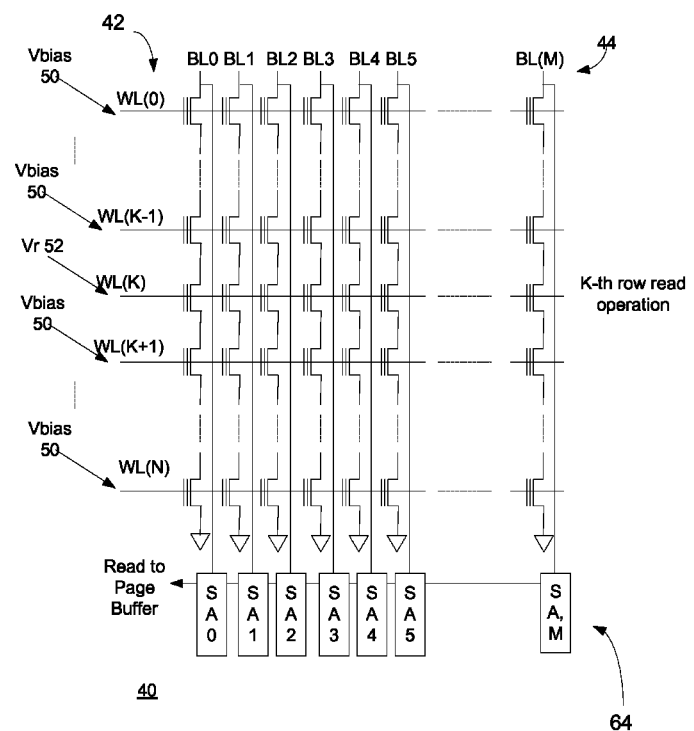
FIG. 3 illustrates a prior art threshold voltage distribution.

FIG. 3 illustrates an exemplary two-dimensional floating gate NAND block 40, with a read operation carried out on the K-th row—WL(K). NAND block 40 includes multiple columns BL0-BL(M) 44, multiple rows WL(0)-WL(N) 42 wherein each column is coupled to a sense amplifier out of sense amplifiers SA(0)-SA(M) 64.

During the read of WL(K) all other rows have to be in pass-through state, as all cells on every column (bit-line) are connected to the same current sense amplifier (SA), in order to read the K-th cell on the j-th column, all other cells on the j-th column have to be in pass-through state.

This state is obtained by applying the bias voltage Vbias 50, while applying the reference voltage (threshold voltage Vr 52) on the K-th row. Then the output of every SA is compared with the predefined threshold and its binary result is sampled into a page buffer. In multi-level cell (MLC) flashes and TLC flashes multiple reads are usually necessary for performing a page read. For example, in order to read one of three pages of a TLC row illustrated in FIG. 1, the MSB page can be read using thresholds $T_0$ and $T_4$, which means that a reference voltage corresponding to $T_0$ is applied, its result at the output of the SAs is digitally sampled, then an additional read is done using a reference voltage corresponding to $T_4$. Similarly a CSB page is read by applying three read operations with voltage thresholds corresponding to $T_1$, $T_3$ and $T_5$, and the LSB page can be read by applying three read operations with voltage thresholds corresponding to $T_2$ and $T_6$.

Bias Voltage Adaptation

According to embodiments of this invention, the bias voltage is adapted throughout the life-span of the flash device in order to enable higher number or read operations without requiring a refresh, i.e. minimizing the disturb generated by a read operation. According to an embodiment of this invention, the read operations are performed in a bias voltage lower than the programming bias voltage. While this approach increases the bit-error rate (BER) on the page of interest, it introduces a smaller disturb on the neighboring rows.

Figure 5:
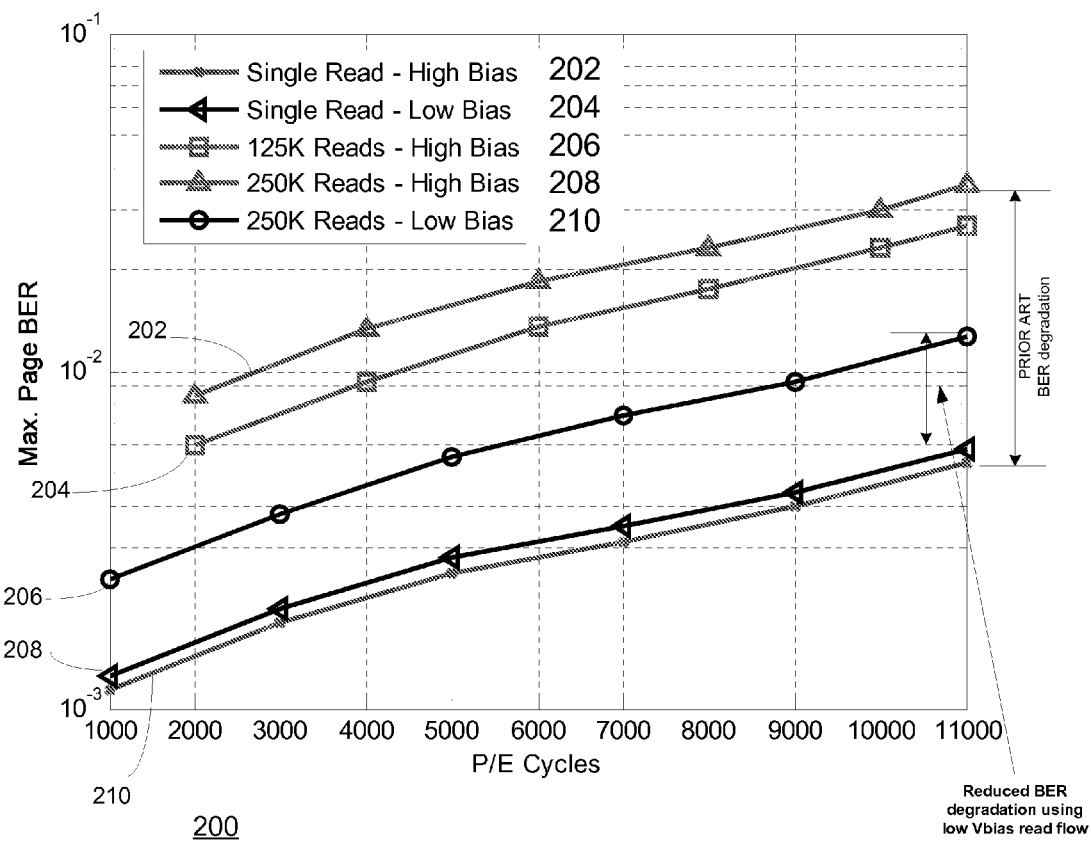
FIG. 5 illustrates a prior art sampling process.

FIG. 5 includes graph 200 that demonstrates the BER versus program erase cycles (P/E cycles) according to this invention, as compared to the BER versus P/E cycles observed for a standard controller which uses the same (high) bias voltage during program and read.

Graph 200 includes five curves 202, 204, 206, 208 and 210—that represent the maximum page BER versus P/E count—for (a) a single read using a high bias voltage, (b) a single read using a low bias voltage, (c) 125K reads using a high bias voltage, (d) 125K reads using a low bias voltage, and (e) 250K reads using a low bias voltage.

As may be observed, the lowest curve 202 is the high-bias single-read result of maximal page BER as function of the cycle count. On the first block read there is still no read-disturb effect, and therefore, the maximal BER measured here is smaller than that of the first read when using a low-bias voltage. In this example, the read-disturb stress is done by reading a specific page many times. In particular after performing for this specific page 250K reads, the whole block is read, and the maximal observed page BER is recorded. As may be noticed, after 250K reads the maximal page BER is considerably higher than what was observed after a single read. In addition, after 250K reads the maximal page BER using low-bias voltage is lower by more than 2 times compared to the maximal page BER using high-bias voltage. To obtain such gain the controller has to adapt the bias voltage to the operation it performs, e.g. during program use the high bias and then during read apply a lower bias. In addition, the controller has to adapt the read thresholds with respect to the bias voltage used for the non-selected rows during read. The embodiments of this invention provide methods for adaptation of the bias voltage to the read flow such that less refresh operations are required, which means that a higher endurance may be obtained, since the write amplification is minimized.

According to another embodiment of this invention, the read flow operation is done with a low bias. The bias voltage is increased for read only on certain read fail conditions. There may be several bias voltage values starting with the lowest system bias voltage up to the highest (usually that would be the program bias voltage). These bias values may be denoted Vb1<Vb2<Vb3< . . . <Vbh where Vb1 is the lowest bias voltage used for read operations, and Vbh is the highest bias voltage applied during read.

Figure 4:
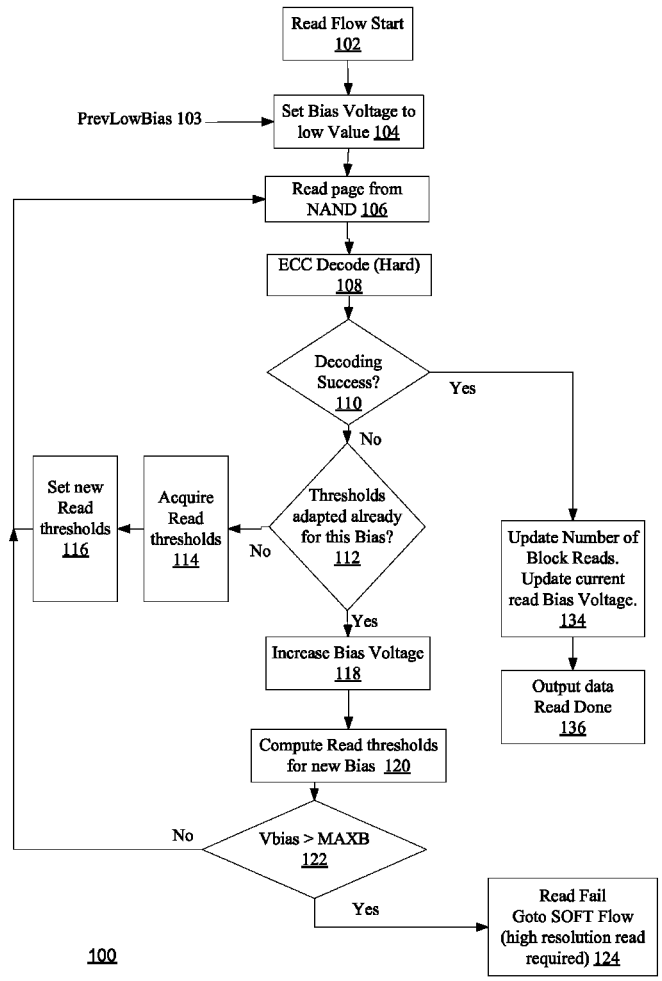
FIG. 4 illustrates a string of flash memory cells.

FIG. 4 provides an exemplary read flow which begins at an initialization step 102 and is followed by setting the bias voltage to low level (104), reading data read at a low bias (106), the read result is decoded using hard decoding (108). The decoding may succeed or fail (110). If the decoding succeeds, updating metadata such as number of block reads and current read bias voltage (134) and outputting (136) the data and complete the read flow.

In case the hard decoding fails, the controller checks whether the read thresholds used for read were already valid—matched to current bias voltage (112).

In case the read thresholds were not valid for the page, a DSP process of acquiring (114) thresholds.

An example for acquiring thresholds can be found in U.S. patent application Ser. No. 13/733,774 titled "READ THRESHOLD DETERMINATION USING REFERENCE READ THRESHOLD".

Once read thresholds are available, they are set (116) on the NAND Flash memory device, and the same page read is done again (step 116 is followed by step 106).

The decoder attempts (108) once again to perform hard decoding.

If it succeeds, data output is possible.

If the decoder fails again (method proceeds to steps 110, 112) the controller may increase (118) the bias voltage for reading.

For example, if the first read was using Vb1, the next read (following threshold acquisition) may be done using Vb2. The motivation for this approach is the fact that the closer the bias-voltage is to the original program bias voltage, the lower is the read noise. Going to soft decoding with low bias voltage is possible, but introduces a performance penalty related to the high resolution NAND sampling.

After increasing the bias voltage the method computes (120) read thresholds for the new (increased) bias voltage. If the new bias voltage (Vbias) exceeds a threshold (MAXB) that may equal to the write bias voltage or differ from it then the method continues to declare a read failure (124) and perform a process that include soft decoding.

If the new bias voltage does not exceed MAXB step 112 is followed by step 106.

In embodiments of this invention the bias voltage is increased and single read with hard decoding is done until successful. Only if the hard decoding fails at the highest bias voltage considered for the read flow, e.g. Vbh, then the controller goes to soft read flow.

According to another embodiment of this invention, the read flow may receive the bias voltage value with which the read page(s) or block was successful on the last read. This is denoted on FIG. 4 as "PrevLowBias". Naturally, on first read attempt the value is the low bias Vb1. The last successfully used bias voltage is used for the page read attempt, and hard decoding. There is no point in using lower bias voltage values, as the BER is expected to be only higher as the number of reads increases, and if a low bias voltage failed once on a certain page, it is expected to fail again. Therefore, it is performance efficient to use the last successful bias voltage PrevLowBias, for the first read attempt in the read-flow. Once the read flow succeeds in decoding, the currently used bias voltage is saved, so that on next read it will serve as a PrevLowBias parameter, and efficient read attempts can be carried out.

According to another embodiment of the invention includes tracking the number of page reads, and assigning the PrevLowBias according to the number of reads done so far. This may be done by updating a read counter after completion of the read flow.

According to another embodiment of the invention, there is a predefined set of default read thresholds per bias voltage. Once the bias voltage is changed, the default read thresholds corresponding to this bias voltage are set on the NAND, and then the read can be done. Such approach saves the need for threshold acquisition every time the read bias voltage changes. The need for different read thresholds is exemplified in FIG. 2, where is can be observed that the VT distribution exhibits a shift relative to the change in the bias voltage. This is since the read values correspond to the difference Vbias-Vr, i.e. the difference between the bias voltage and the reference voltage on the selected row.

Figure 6:
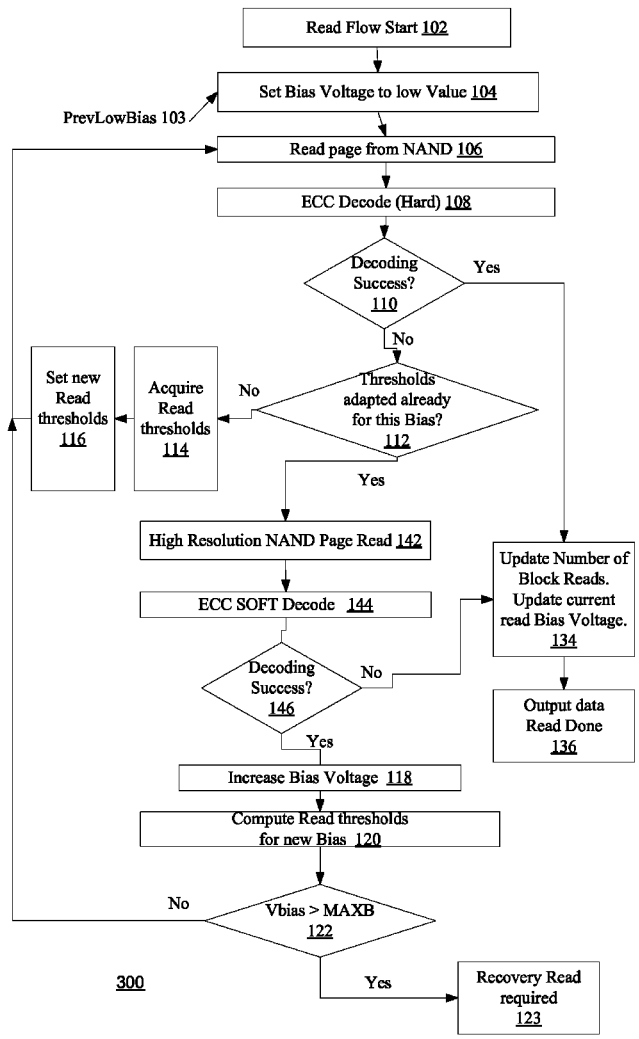
FIG. 6 illustrates a sampling process according to an embodiment of the invention.

FIG. 6 method 300 according to an embodiment of the invention.

During method 300 the controller attempts reading with low bias and hard decoding.

Method 300 of FIG. 6 differs from method 100 of FIG. 4 by including, between steps 112 and 118, steps 142, 144 and 146.

Step 142 includes performing a high resolution NAND page read 142.

Step 142 is followed by step 144 of performing a soft decoding. Step 144 may be followed by step 146 of checking if the soft decoding succeeded. If yes—step 146 is followed by step 118. Else—step 146 is followed by step 134.

Accordingly—if hard decoding fails, the process performs soft sampling and then soft decoding, and only if soft decoding fails the read-flow increases the bias voltage. There may be several bias voltage values starting with the lowest system bias voltage up to the highest (usually that would be the program bias voltage). These bias values may be denoted Vb1<Vb2<Vb3< . . . <Vbh where Vb1 is the lowest bias voltage used for read operations, and Vbh is the highest bias voltage applied during read, where Vbh may correspond for example to the bias voltage used during programming. FIG. 6 illustrates a read-flow which attempts to read at a low bias, the read result is decoded using hard decoding. If the decoding succeeds, output data and complete the read flow. In case the hard decoding fails, the controller checks whether the read thresholds used for read were already valid. In case the read thresholds were not valid for the page, a DSP process of acquiring thresholds may be applied. Once read thresholds are available, they are set on the Flash device, and the same page read is done again. The decoder attempts once again to perform hard decoding. If it succeeds, data output is possible, but if fails, then the controller may perform high-resolution NAND sampling and attempt soft decoding. If the soft decoding failed, increase the bias voltage for reading. For example, if the first read was using Vb1, the next read (following threshold acquisition) may be done using Vb2. If soft decoding failed for bias voltage higher than a MAXB, i.e. Vbias>MAXB (122) and soft decoding failed, then recovery read is to be done. In recovery read, the data may be restored from raid, if available, or by any other similar recovery process.

According to embodiments of this invention, soft decoding effort is a function of the bias voltage used. For example, if the bias voltage is Vb1, then perform only 2-bit soft decoding at a limited decoding complexity, e.g. limit the soft decoding at Vb1 to timeout Time1. If the bias voltage is Vbh, the perform soft decoding at a different decoding complexity, e.g. limit the soft decoding at Vbh to timeout TimeH, where it is expected to succeed at up to TimeH since the bias conditions should introduce minimal additional noise in this condition.

According to another embodiment of this invention, the read flow saves the decoding success type (hard/soft) for the page(s) block following the decoding success. That is, the read flow records the last bias voltage and read counter and decoding type, at the end of the read-flow. This is used during initial phase of the read-flow when trying to read again the same page(s) or block. If for example, the read flow succeeded with bias voltage Vb3, a given set of thresholds, and soft decoding, the next time read flow starts it may use these parameters, and skip inefficient attempts which are doomed to fail anyway.

Figure 7:
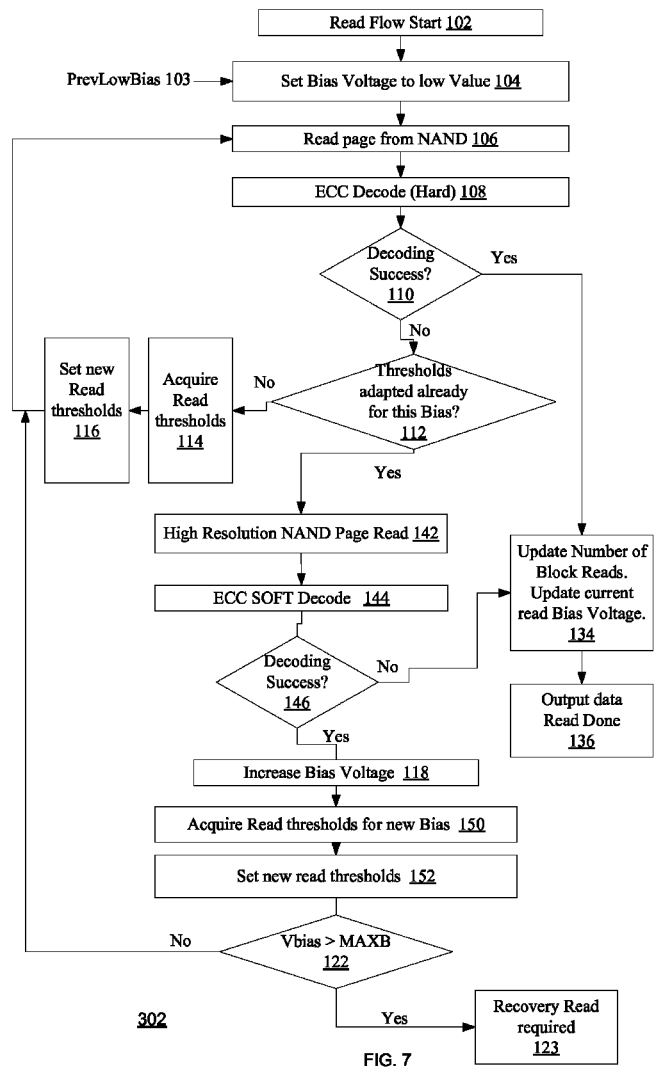
FIG. 7 illustrates a sampling process according to an embodiment of the invention.

FIG. 7 illustrates method 302 according to an embodiment of the invention.

Method 302 differs from method 300 by including step 150 of acquiring read thresholds for the new bias voltage and step 152 of setting the new read thresholds—instead of step 120 of method 300 (computing the read thresholds for the new bias voltage).

FIG. 7 exemplifies another possible read-flow according to embodiments of this invention. The controller attempts reading with low bias and hard decoding. If hard decoding fails, it performs soft decoding, and only if soft decoding fails the read-flow increases the bias voltage. In such case it may decide not to try hard decoding but perform high resolution sampling and soft decoding with the increased bias voltage. This read-flow attempts to read at a low bias voltage, the read result is decoded using hard decoding. If the decoding succeeds, it outputs the data and completes the read flow. In case the hard decoding fails, the controller checks whether the read thresholds used for read were already valid. In case the read thresholds were not valid for the page, a DSP process of acquiring thresholds may be applied. Once read thresholds are available, they are set on the Flash device, and the same page read is done again. The decoder attempts once again to perform hard decoding. If it succeeds, data output is possible, but if fails, then the controller may perform high-resolution NAND sampling and attempt soft decoding. If the soft decoding failed, increase the bias voltage for reading. For example, if the first read was using Vb1, the next read (following threshold acquisition) may be done using Vb2. Then perform high resolution NAND sampling to provide the decoder with soft information, and perform soft decoding at a designated decoding complexity. This is repeated until decoding succeeds via soft decoding. It is pointed out that soft decoding (at its highest performance) when the data is read with the highest bias voltage is not expected to fail under the system time constraints, on a carefully designed system, as the reliability of a storage system output BER is to be below $<10^{-15}$. Since read operations increases the BER of neighboring page(s), the controller may use the BER values of successfully decoded pages and the page(s) or block read counter, and schedule a refresh if necessary.

According to another embodiment of this invention, at the end of a read-flow, conditions of bias voltage and decoder corrected error count (decoded BER) are tested. If the conditions for high bias voltage and high ECC BER are satisfied then the controller schedules a refresh operation. The refresh may be done on a whole block or may be applied on a limited set of pages which have been mostly disturbed. For example, if a block suffered from disturbs due to many read operations of a single page, only a few neighboring rows are strongly affected. The other rows suffer only a mild degradation, and therefore only the few rows with high BER can be copied to a different block, i.e. refreshed.

Figure 8:
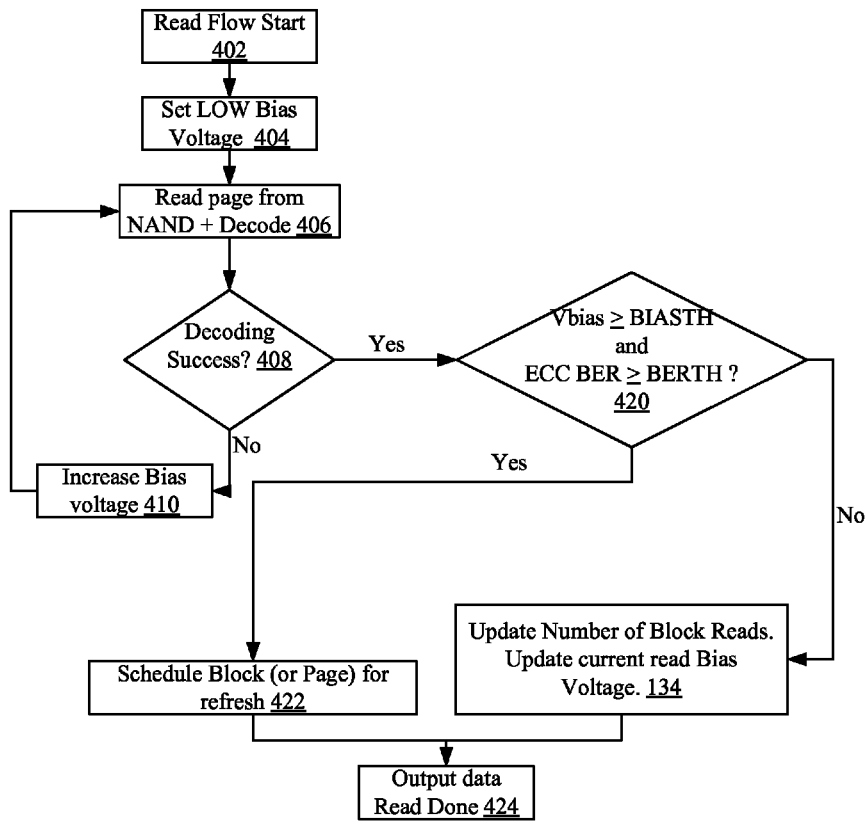
FIG. 8 illustrates a sampling buffers according to an embodiment of the invention.

FIG. 8 illustrates method 400 according to embodiments of this invention.

Method 400 may start by initialization step 402, continues to step 404 of setting LOW bias voltage, step 406 of reading a page from the NAND flash memory and decoding the read data and checking (408) if the decoding succeeded. If the decoding failed—increasing the bias voltage (410) and jumping to step 406. If the decoding succeeded then checking (420) whether Vbias exceeds a bias voltage threshold and the BER exceeds a BER threshold—if yes—scheduling the block (or page) for refresh 422 and outputting the read data (424). If no—updating metadata (134) and jumping to step 424.

According to another embodiment of the invention, a refresh operation is triggered from a test read-flow, which operates on candidate page(s) and/or blocks, and according to the statistics at the end of the test it decides which page(s) and/or blocks are scheduled for refresh.

Figure 9:
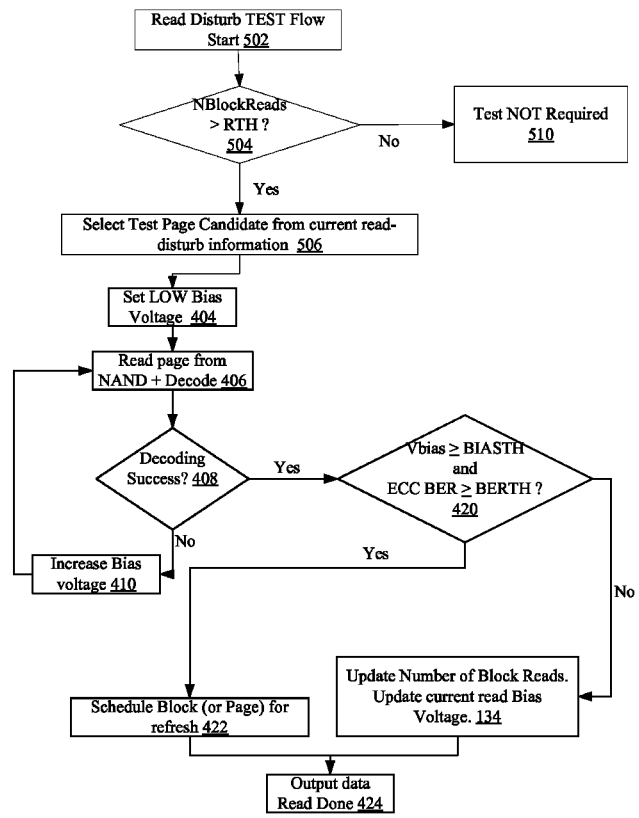
FIG. 9 illustrates a method according to an embodiment of the invention

FIG. 9 illustrates method 500 according to an embodiment of the invention.

Method starts by an initialization step (502), that is followed by checking (504) whether the number of read attempts of a block NBlockReads exceeds a read threshold RTH—if so selecting a test page candidate from a current read-disturb information (506) and executing steps 402, 404, 406, 408, 410, 420, 422, 134 and 424 of method 400.

If NblockReads does not exceed RTH—there is no need to perform the test (510).

The testing (initialization of method 500) may be done periodically, as part of the system cleaning and wear-leveling operation, or according to the number of reads performed on different blocks. Candidate blocks may be blocks which have been read many times and may potentially contain highly disturbed pages.

As indicated above—the test flow may include a first step of comparison of number of reads to a threshold, denoted by RTH in FIG. 9. If the number of reads exceeds RTH then a subset of pages within the candidate block are selected. This is possible when there is prior knowledge of potentially disturbed pages. When no prior knowledge is available, the test flow can perform full block reads or read a representative sample of pages. Then the test flow sets the low bias voltage (or the last bias value that was used to successfully read this block). This test read flow repeats similarly to read flows described above with changing bias voltage setting, see examples described in FIGS. 4, 6 and 7, etc. then conditions of bias voltage and decoder corrected error count (decoded BER) are tested. If the conditions for high bias voltage and high ECC BER are satisfied then the controller schedules a refresh operation. The refresh may be done on a whole block or may be applied on a limited set of pages which have been mostly disturbed. In addition, when refresh is not necessary, the system updates the bias voltage for which the read was successful for this test block, to be used by operational read operations later, and be able to provide high performance reads.

According to another embodiment of this invention, the controller can decide (upon user request, system needs, or other considerations) to perform read operation with high Vbias directly to achieve low latency read (high priority read). In this way, the controller can trade-off latency with disturb effect. For example, if the user needs a piece of data stored on a certain NAND block very quickly, the system can avoid opportunistic reading with low Vbias and go directly to high Vbias read, taking into account the additional disturb which might incur to this block. The expected latency while reading with highBias/lowBias can be estimated by the controller using previously reads and current block's P/E counter and other state information.

According to another embodiment of this invention, after decoding failure (hard or soft) with lowBias, the controller can decide to perform additional read with high Bias and jointly use lowBias & highBias reads to perform successful soft decoding. In this approach, the controller can first use the high Vbias information and perform hard decoding. If hard decoding fails, it can use additional read/s obtained using low Vbias read as refined/soft information for the decoder, where high Vbias information should be regarded as more reliable information.

Modified Erase Operation

In order to increase the overall endurance it is suggested to utilize the side effect of the read operation, which modifies the programmed data distribution. According to embodiments of this invention, there are two main approaches to be considered. The first is performing dummy reads, in order to bring the number of reads on a block to a desired target. Following these dummy reads, the effect of unintentional programming which is mainly on the lower lobes translates to a modified erase distribution. Another possible approach is to perform a program operation before the erase. This program is intended to change the cells in the erase state into the first level, with a minor effect on other levels. As a result, the effective programming window of the programmed data is smaller and narrowed, enabling the same erase operation to end up with a better voltage distribution.

Figure 10:
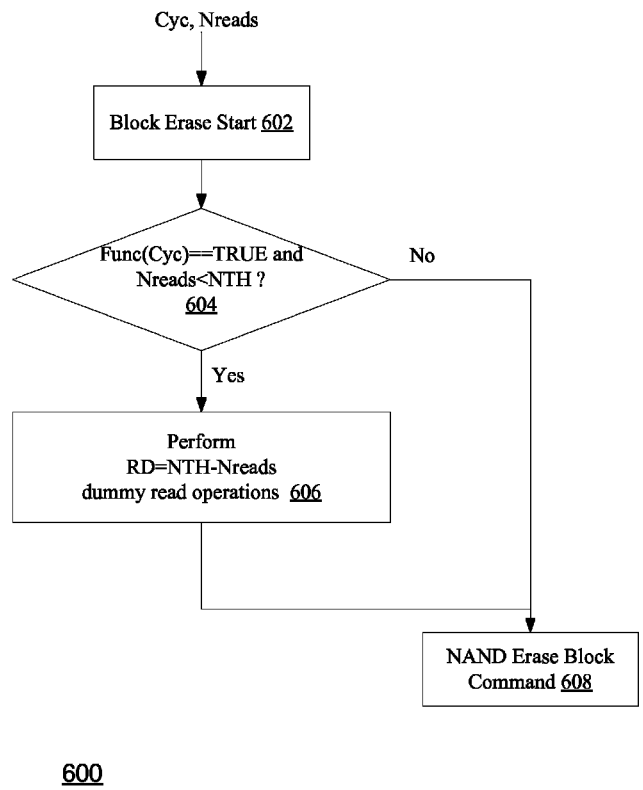
FIG. 10 illustrates a sampling process according to an embodiment of the invention.

FIG. 10 demonstrates a modified erase flow 600 according to embodiments of this invention.

Erase flow 600 start by an initialization step 602.

This flow may be activated periodically, every N erase operations. In such case the function F(c) may be for example: $F(c) = \{_{0 \; otherwise}^{1 \; mod(c, N)=0}$ Where c is the current cycle count of the block which is about to be erased, and N is the modified erase activation period.

If F(c) is 1 and the number of reads done so far on the block, denoted by Nreads, is smaller (evaluated during step 604) than a threshold NTH, then dummy reads (step 606) are performed.

The number of dummy reads may equal NTH-Nreads.

Steps 606 and 604 may be followed by performing a NAND erase block command 608.

As an embodiment of this invention, the dummy reads may be read operations for which the NAND samples the page data into internal buffers, but does not output the data. Such read operations are faster, than a complete read which requires data transfer per read. The number of dummy reads to perform is NTH-Nreads, to have sufficiently many reads on the block, and then a NAND erase operation can be done by issuing a NAND erase command.

Figure 11:
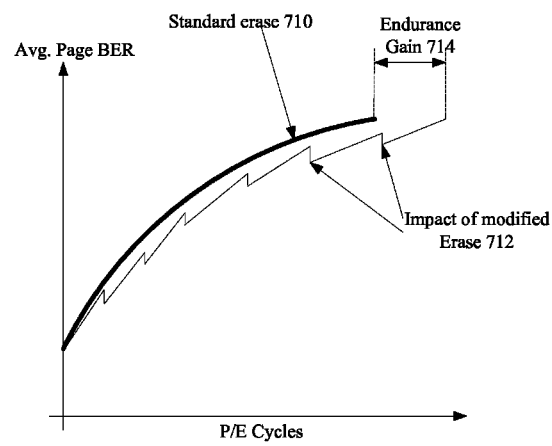
FIG. 11 illustrates a die and a flash memory controller according to an embodiment of the invention.

FIG. 11 exemplifies a relationship between an average page BER for reading a block as function of the cycle count (P/E cycles).

Curve 710 illustrates a prior art relationship between BER and P/E cycles. The BER constantly increases with an increase of P/E cycles.

Curve 712 represents the average page BER for using a modified erase for every N cycles—as illustrated in FIG. 10. It may be noticed that after applying the modified erase the page BER of the next cycle is reduced. This allows in overall to achieve a higher endurance under the same reliability requirements. The endurance gain is denoted 714.

According to another embodiment of the invention, instead or in addition to the dummy reads before erase, a dummy-program operation of non-random data, such that only cells in the erase state are actually programmed to the first (or second) level. This dummy-programming is followed by the NAND erase operation which can be done by issuing a NAND erase command.

According to an embodiment of the invention there may be provided a first method for wear reduction of a flash memory module according to an embodiment of the invention. The first method may include:

1) Reading data stored in a group of flash memory cells to provide a read data. The reading may include supplying a bias voltage that is lower than a write bias voltage. The write bias voltage was supplied to the group of flash memory cells during a writing of the data to the group of flash memory cells. The group of flash memory cells may be a page or any other group of flash memory pages. The write bias voltage may be selected as a highest bias voltage within a range of allowable bias voltages.
2) Decoding the read data, by applying a decoding process of a given complexity, to provide decoded data.
3) Increasing, when the decoding of the read data fails and while the bias voltage is below a bias threshold, a value of the bias voltage. The increasing of the voltage bias may be preceded by determining the value of the (incremented) next bias. This determining may include determining a bias voltage to be applied during a next read of the group of flash memory cells in response to an outcome of the reading of the data stored in the group of flash memory cells. Alternatively, the determination of the bias voltage may include determining or receiving a bit error rate (BER) related to the group of flash memory cells and determining a bias voltage to be applied during a next read of the group of flash memory cells in response to the BER related to the group of flash memory cells and to a number of reads of the group of flash memory cells (or the number of reads related to a block that comprises the group of flash memory cells). According to an embodiment of the invention when the decoding of the read data fails and the bias voltage reaches the bias threshold then applying another decoding process in the read data. The applying of the other decoding process may be preceded by performing one or more additional reads of the data. According to an embodiment of the invention the multiple reads may be used to provide soft information at the decoder input.
4) Adjusting read thresholds to the bias voltages supplied to the group of flash memory cells before increasing the value of the bias voltage. The adjusting may include, for example, calculating the read thresholds, fetching the read thresholds, selecting read thresholds out of predefined read thresholds that match the bias voltages supplied to the group of flash memory cells before increasing the value of the bias voltage. Non-limiting examples of read thresholds acquisitions are provide in steps 114, 116 and 120 of FIGS. 6 and 7.

5) Scheduling the group of flash memory cells to be refreshed when a number of reading related to a block that includes the group of flash memory cells (or the number of reading related to the group of flash memory cells) reaches a reading threshold and a bit error rate (BER) related to the group of flash memory cells reaches a predefined BER threshold.

6) Performing multiple dummy read operations of the group of flash memory before erasing the group of flash memory. This may include supplying, during each dummy read operation, the write bias voltage to the group of flash memory cells.

According to another embodiment of the invention there may be provided a second method for wear reduction of a flash memory module according to an embodiment of the invention. The second method may include:

1) Reading data stored in a group of flash memory cells to provide a read data. The reading may include supplying a bias voltage that is lower than a write bias voltage. The write bias voltage was supplied to the group of flash memory cells during a writing of the data to the group of flash memory cells.
2) Decoding the read data, by applying a decoding process of a given complexity, to provide decoded data.
3) Checking whether the decoding of the read data fails and whether the bias voltage is below a bias threshold.
4) If the decoding of the read data fails and whether the bias voltage is below a bias threshold then applying another decoding process in the read data. The complexity of the other decoding process exceeds the given complexity.
5) Checking whether the other decoding of the read data fails and while the bias voltage is below the write bias voltage.
6) If the other decoding of the read data fails and while the bias voltage is below the write bias voltage then increasing a value of the bias voltage and repeating the reading and decoding.
7) When the decoding of the read data fails and the bias voltage reaches the bias threshold then performing one or more additional reads of the data.
8) Adjusting read threshold to the bias voltages supplied to the group of flash memory cells before increasing the value of the bias voltage and performing additional reads of the group of flash memory cells.
9) Scheduling the group of flash memory cells to be refreshed. This may occur for various reasons—for example—when a number of reading reaches a reading threshold and a bit error rate (BER) related to the group of flash memory cells reaches a predefined BER threshold.
10) Performing multiple dummy read operations of the group of flash memory before erasing the group of flash memory.

According to another embodiment of the invention there may be provided a third method for wear reduction of a flash memory module according to an embodiment of the invention. The third method may include 1) Reading data stored in a group of flash memory cells to provide a read data;
2) Decoding the read data, by applying a decoding process of a given complexity, to provide decoded data;
3) Scheduling the group of flash memory cells to be erased; and
4) Performing multiple dummy read operations of the group of flash memory before erasing the group of flash memory. Each dummy read operation may include supplying a write bias voltage to the group of flash memory cells; and wherein the write bias voltage was supplied to the group of flash memory cells during a writing of the data to the group of flash memory cells.

Various combination of the steps of the first, second and third methods are illustrated in FIGS. 4, 6, 7, 8, 9 and 10.

According to another embodiment of the invention, following erase, a dummy programming to a single level can be done, followed by an erase operation, after which the actual programming takes place. In this case, the fine programming of all cells to a non-erase, SLC like distribution, and applying an additional erase operation may provide a narrow erase distribution (following the last erase operation). This enables obtaining a fine program distribution with lower RBER.

Any reference to the term "comprising" or "having" should be interpreted also as referring to "consisting" of "essentially consisting of". For example—a method that comprises certain steps can include additional steps, can be limited to the certain steps or may include additional steps that do not materially affect the basic and novel characteristics of the method—respectively.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for wear reduction of a flash memory module, the method comprising:

reading data stored in a group of flash memory cells to provide a read data, the reading step including supplying a bias voltage that is lower than a write bias voltage, the write bias voltage being supplied to the group of flash memory cells during a writing of the data to the group of flash memory cells, wherein the write bias voltage is selected as a highest bias voltage within a range of allowable bias voltages; and decoding the read data, by applying a decoding process of a given complexity, to provide decoded data.

2. The method according to claim 1, further comprising increasing, when the decoding of the read data fails and while the bias voltage is below a bias threshold, a value of the bias voltage and repeating the reading and the decoding.

3. The method according to claim 2, wherein the bias threshold equals the write bias voltage.

4. The method according to claim 2, wherein the bias threshold exceeds the write bias voltage.

5. The method according to claim 2, wherein the bias threshold is below the write bias voltage.

6. The method according to claim 2, wherein when the decoding of the read data fails and the bias voltage reaches the bias threshold then applying another decoding process in the read data; and wherein a complexity of the other decoding process exceeds the given complexity.

7. The method according to claim 6, wherein when the decoding of the read data fails and the bias voltage reaches the bias threshold then performing one or more additional reads of the data.

8. The method according to claim 7, further wherein the decoding process is a hard decoding process and the other decoding process is a soft decoding process.

9. The method according to claim 2, further comprising adjusting read thresholds to the bias voltages supplied to the group of flash memory cells before increasing the value of the bias voltage.

10. The method according to claim 2, further comprising selecting read thresholds out of predefined read thresholds that match the bias voltages supplied to the group of flash memory cells before increasing the value of the bias voltage.

11. The method according to claim 1, further comprising scheduling the group of flash memory cells to be refreshed when a number of reading related to a block that comprises the group of flash memory cells reaches a reading threshold and a bit error rate (BER) related to the group of flash memory cells reaches a predefined BER threshold.

12. The method according to claim 1, further comprising scheduling the group of flash memory cells to be refreshed when a number of reading of the group of flash memory cells reaches a reading threshold and a bit error rate (BER) related to the group of flash memory cells reaches a predefined BER threshold.

13. The method according to claim 1, further comprising determining a bias voltage to be applied during a next read of the group of flash memory cells in response to an outcome of the reading of the data stored in the group of flash memory cells.

14. The method according to claim 1, further comprising determining a bit error rate (BER) related to the group of flash memory cells and determining a bias voltage to be applied during a next read of the group of flash memory cells in response to the BER related to the group of flash memory cells and to a number of reads of the group of flash memory cells.

15. The method according to claim 1, further comprising determining a bit error rate (BER) related to the group of flash memory cells and determining a bias voltage to be applied during a next read of the group of flash memory cells in response to the BER related to the group of flash memory cells and to a number of reads related to a block that comprises the group of flash memory cells.

16. The method according to claim 1, further comprising scheduling the group of flash memory cells to be erased; and performing multiple dummy read operations of the group of flash memory before erasing the group of flash memory; wherein each dummy read operation comprises supplying the write bias voltage to the group of flash memory cells.

17. The method according to claim 1, further comprising scheduling the group of flash memory cells to be erased; and performing multiple dummy read operations of the group of flash memory before erasing the group of flash memory.

18. The method according to claim 1, further comprising scheduling the group of flash memory cells to be refreshed when a number of reading reaches a reading threshold and a bit error rate (BER) related to the group of flash memory cells reaches a predefined BER threshold.

19. The method according to claim 1, further comprising scheduling the group of flash memory cells to be erased; and performing multiple dummy read operations of the group of flash memory before erasing the group of flash memory.

20. The method according to claim 1, further wherein the write bias voltage is selected as a highest bias voltage within a range of allowable bias voltages.

21. A method for wear reduction of a flash memory module, the method comprising:
    reading data stored in a group of flash memory cells to provide a read data, the reading step including supplying a bias voltage that is lower than a write bias voltage, the write bias voltage being supplied to the group of flash memory cells during a writing of the data to the group of flash memory cells;
    decoding the read data, by applying a decoding process of a given complexity, to provide decoded data; and
    scheduling the group of flash memory cells to be refreshed when a number of reading reaches a reading threshold and a bit error rate (BER) related to the group of flash memory cells reaches a predefined BER threshold.

22. The method according to claim 21, further comprising increasing, when the decoding of the read data fails and while the bias voltage is below a bias threshold, a value of the bias voltage and repeating the reading and the decoding.

23. The method according to claim 22, wherein the bias threshold equals the write bias voltage.

24. The method according to claim 22, wherein the bias threshold exceeds the write bias voltage.

25. The method according to claim 22, wherein the bias threshold is below the write bias voltage.

26. The method according to claim 22, wherein when the decoding of the read data fails and the bias voltage reaches the bias threshold then applying another decoding process in the read data; and wherein a complexity of the other decoding process exceeds the given complexity.

27. The method according to claim 26, wherein when the decoding of the read data fails and the bias voltage reaches the bias threshold then performing one or more additional reads of the data.

28. The method according to claim 27, wherein the decoding process is a hard decoding process and the other decoding process is a soft decoding process.

29. The method according to claim 22, further comprising adjusting read thresholds to the bias voltages supplied to the group of flash memory cells before increasing the value of the bias voltage.

30. The method according to claim 22, further comprising selecting read thresholds out of predefined read thresholds that match the bias voltages supplied to the group of flash memory cells before increasing the value of the bias voltage.

31. The method according to claim 21, wherein the write bias voltage is selected as a highest bias voltage within a range of allowable bias voltages.

* * * * *